Sept. 13, 1960 G. L. PEARSON 2,952,824

SILICON ALLOY DIODE

Filed June 18, 1958

INVENTOR
G. L. PEARSON
BY Arthur J. Torsiglieri
ATTORNEY

United States Patent Office
2,952,824
Patented Sept. 13, 1960

2,952,824

SILICON ALLOY DIODE

Gerald L. Pearson, Bernards Township, Somerset County, N.J., assignor to Bell Telephone Laboratories, Incorporated, New York, N.Y., a corporation of New York Filed June 18, 1958, Ser. No. 742,879
4 Claims. (Cl. 338—20)

This invention relates to semiconductor diodes and more particularly to silicon alloy diodes.

In a modern telephone system, there is a need for voltage limiters for minimizing the objectionable effects of voltage surges. Typical elements of this kind are the so-called "click reducers." Because this need is large, it is desirable to have an element which is reliable and rugged, yet inexpensive. In one aspect, the present invention is directed at filling such and related needs.

In modern electronic computers, there is a large need for a switching diode which is reliable, rugged, and inexpensive and yet capable of very high switching rates at low switching voltages. In another aspect, the present invention is directed at providing such a computer diode.

In microwave communication systems, there is a need for microwave detectors which can operate at extremely high frequencies. In another aspect, the present invention is directed at providing a microwave detector useful at extremely high frequencies.

The present invention is based on the discovery that a silicon diode which comprises monocrystalline n-type silicon in which a rectifying junction has been formed by the alloyage of an aluminum connector displays anomalous properties as the specific resistivity of the silicon is decreased to very low values.

In particular, it has been found that when there is employed in such a diode silicon whose specific resistivity is approximately .005 ohm-centimeter, which is silicon of much lower resistivity than has been thought suitable for use in silicon diodes, the voltage-current characteristic of the diode is symmetric about the origin, the voltage saturating at about 0.7 volt in either direction. Such a diode is useful as a symmetric voltage limiter.

Moreover, it is found that lowering the resistivity of the bulk silicon below .005 ohm-centimeter further reduces the reverse saturation voltage. For reverse saturation voltages less than 0.7, the sign of rectification reverses and maximum currents flow when a positive potential is applied to the n-type electrode. Such a diode avoids the limitation characteristic of silicon diodes that voltages at least in excess of 0.7 volt must be applied before appreciable current will flow. In particular, by use of a silicon bulk of .001 ohm-centimeter resistivity, the reverse voltage saturates at 0.2 volt, and, accordingly, such a diode can be made to pass substantial currents for low applied reverse voltages. An additional advantage stems from the fact that in such an arrangement the injected current consists of majority, rather than minority, carriers. In particular as a consequence, such a diode will be capable of operation at much higher frequencies than conventional minority-carrier injection diodes since the dielectric relaxation time of majority carriers, which is the principal limiting effect in majority-carrier injection diodes, typically is much shorter than the recombination time of minority carriers, which is the principal limiting effect in minority carrier injection diodes.

Figure 1:
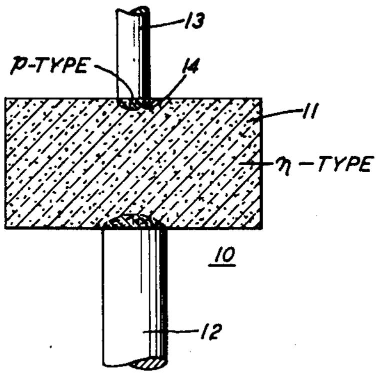
Fig. 1 shows a silicon alloy diode in accordance with the invention.

With reference now to Fig. 1, the diode 10 comprises a monocrystalline silicon wafer 11 whose bulk is of n-type conductivity. Electrode 12 on one broad face of the wafer makes a low resistance connection to the n-type bulk of the wafer. Electrode 13 on the opposite broad face makes low resistance connection to a small p-type portion 14 of the wafer formed by the alloyage of aluminum therein. Advantageously, the electrode 12 is a wire of gold doped with .1 percent antimony and the electrode 13 is an aluminum wire.

Diodes of this kind have been fabricated utilizing a process of the kind set forth in my Patent No. 2,757,324. In particular, a diode having a symmetric voltage current characteristic shown by the curve A in Fig. 2 was made as follows:

A monocrystalline n-type silicon wafer which was twenty mils thick and forty mils square and whose specific resistivity was .005 ohm-centimeter was cut out of a large crystal of suitable resistivity. The wafer was then etched lightly for cleaning and removing damaged surface material by immersion for about fifteen seconds in a solution consisting of a mixture of about equal parts of concentrated nitric acid and concentrated hydrofluoric acid. After withdrawal from the etching solution, the wafer was rinsed in turn in deionized water and methyl alcohol. After drying, the wafer was positioned on a tantalum strip heater and a ten mil wire of gold doped with 0.1 percent antimony was positioned to have one of its ends in slight pressure contact with a central portion of one of the square faces of the wafer. A current was then passed through the tantalum strip of magnitude sufficient to heat the wafer quickly to a temperature in excess of the gold-antimony-silicon eutectic whereby the wire was alloyed to the wafer and formed a bonded low resistance ohmic connection thereto. The alloyage was performed in a nitrogen atmosphere.

The wafer was removed from the strip heater and recleaned by immersion for five seconds in the etchant described above and by rinsing in turn in deionized water and alcohol. After recleaning, the wafer was remounted on the strip heater so as to expose the square face opposite that to which the gold wire had already been bonded. An aluminum wire of about five mils diameter and which had been etched lightly for cleaning was positioned to have one of its ends bear against the exposed surface of the wafer. Again in a nitrogen atmosphere current was passed through the strip heater of magnitude sufficient to heat the wafer to a temperature in excess of the aluminum-silicon eutectic whereby the aluminum wire was bonded to the wafer. Because the gold wire bonded originally was thicker, this later alloying step could be performed without affecting deleteriously the gold wire bond despite the fact that the aluminum-silicon eutectic is higher than the gold-silicon eutectic.

The completed diode was cleaned by immersion for about twenty seconds in an etching solution of the kind described above followed by boiling in deionized water for about five minutes. After drying, the diode was potted in a low-melting point glass in the manner described in copending application Serial No. 730,832, filed April 28, 1958, by S. S. Flashchen and A. D. Pearson and leads were connected to the gold and aluminum wires, respectively, to provide a finished product.

Figure 2:
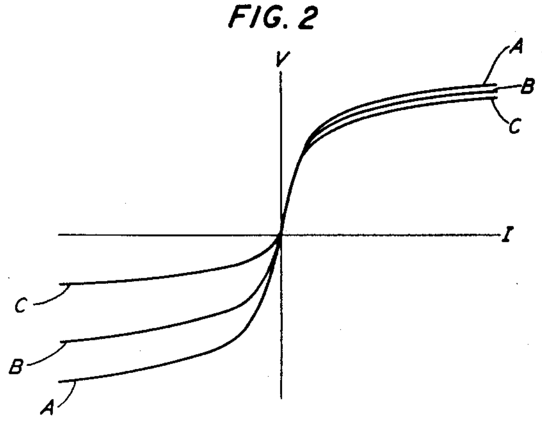
Fig. 2 shows the voltage-current characteristics of silicon alloy diodes of this kind for different values of the resistivity of the silicon bulk.

The process described also was employed to fabricate silicon alloy diodes having the characteristics depicted by curves B and C in Fig. 2. Curve B is the characteristic of a diode formed with starting material having a specific resistivity of .003 ohm-centimeter and curve C corresponds to a diode made from material having a specific resistivity of .001 ohm-centimeter. It can be seen that the lower the specific resistivity of the starting material the lower the value at which the voltage saturates in the reverse direction. On the other hand, the value at which the voltage saturates in the forward direction is only slightly affected by the specific resistivity of the starting material. In diodes utilizing starting material of specific resistivity significantly lower than .001 ohm-centimeter, the reverse breakdown becomes too soft for most purposes.

It is now well recognized that reverse breakdown in conventional silicon diodes is the result of the creation of the hole-electron pairs by the collision of high energy electrons with bound electrons in an avalanche fashion. However, the theory associated with such a mechanism is inadequate to explain the results achieved with silicon diodes in accordance with the invention, since the threshold energy required to cause hole-electron pairs by collision is much greater than that corresponding to the saturation voltage of these diodes. Rather, it is believed that in such diodes the high reverse currents are associated with an internal field emission mechanism. In these diodes, it is believed that the combination of a low resistivity bulk material and a low resistivity alloy region results in a very narrow p-n junction having a built-in electrostatic field of high strength so that internal field emission is possible when augmented even by applied fields of low strength.

In the light of this explanation, it can be realized that an important element of a diode in accordance with the invention is a narrow p-n junction with which there is associated a built-in electrostatic field of high strength. It is evident that such a diode may be realized in a variety of forms other than that described above. In particular, the use of other than aluminum alloy regions, such as gallium alloy regions, is feasible, although less desirable. Additionally, it is feasible to form the alloy regions from pellets of appropriate materials rather than from wires so long as the alloying cycle is designed to provide sufficiently narrow p-n junctions. Similarly, in some instances, it may be feasible to utilize polycrystalline silicon.

What is claimed is:

1. A silicon diode whose reverse saturation voltage is lower than its forward saturation voltage comprising a monocrystalline silicon wafer whose bulk is n-type and has a specific resistivity of no greater than .005 ohm-centimeter and which includes a p-type aluminum-alloy region, and separate connections to the bulk and to the aluminum-alloy region.

2. A silicon diode having a substantially symmetric voltage-current characteristic comprising a monocrystalline silicon wafer whose bulk is n-type and has a specific resistivity of about .005 ohm-centimeter and which includes a p-type aluminum-alloy region, and separate connections to the bulk and to the aluminum-alloy region.

3. A silicon diode whose reverse saturation voltage is lower than its forward saturation voltage comprising a monocrystalline silicon wafer whose bulk is n-type and has a specific resistivity in the range between .005 ohm-centimeter and .001 ohm-centimeter and which includes a p-type aluminum-alloy region, and separate connections to the bulk and to the aluminum-alloy region.

4. A silicon diode whose reverse saturation voltage is lower than its forward saturation voltage comprising a monocrystalline silicon wafer whose bulk is n-type and has a specific resistivity between .005 ohm-centimeter and .001 ohm-centimeter and which includes an alloy region for defining with the bulk a narrow p-n junction, and separate connections to the bulk and to the alloy region.

References Cited in the file of this patent

UNITED STATES PATENTS

| | | |
|---|---|---|
| 2,763,822 | Frola et al. | Sept. 18, 1956 |
| 2,805,370 | Wilson | Sept. 3, 1957 |
| 2,811,682 | Pearson | Oct. 29, 1957 |